(12) United States Patent
Hirayama et al.

(10) Patent No.: US 8,975,188 B2
(45) Date of Patent: Mar. 10, 2015

(54) PLASMA ETCHING METHOD

(75) Inventors: Yusuke Hirayama, Miyagi (JP); Kazuhito Tohnoe, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/131,704

(22) PCT Filed: Jul. 10, 2012

(86) PCT No.: PCT/JP2012/067612
§ 371 (c)(1),
(2), (4) Date: Jan. 9, 2014

(87) PCT Pub. No.: WO2013/008824
PCT Pub. Date: Jan. 17, 2013

(65) Prior Publication Data
US 2014/0134846 A1   May 15, 2014

(30) Foreign Application Priority Data

Jul. 12, 2011   (JP) .................. 2011-154175

(51) Int. Cl.
*H01L 21/311*   (2006.01)
*H01L 21/302*   (2006.01)
*H01L 21/461*   (2006.01)
*H01L 21/30*   (2006.01)
*H01L 21/46*   (2006.01)
*H01L 21/3065*   (2006.01)
*H01J 37/32*   (2006.01)
(Continued)

(52) U.S. Cl.
CPC ....... *H01L 21/3065* (2013.01); *H01J 37/32082* (2013.01); *H01L 21/76898* (2013.01); *H01J 37/3266* (2013.01); *H01L 21/30655* (2013.01); *H01L 21/3081* (2013.01); *H01L 21/31116* (2013.01); *H01L 21/31138* (2013.01)
USPC ........... 438/702; 438/703; 438/710; 438/714; 438/719; 438/696; 438/459

(58) Field of Classification Search
CPC ...................... H01L 21/3065; H01L 21/30655
USPC ......... 438/703, 706, 710, 714, 689, 696, 700, 438/702, 459
See application file for complete search history.

(56) References Cited

U.S. PATENT DOCUMENTS 4,855,017 A * 8/1989 Douglas ................ 438/695
6,051,503 A * 4/2000 Bhardwaj et al. ......... 438/705
(Continued)

FOREIGN PATENT DOCUMENTS

JP   11-097414   4/1999

*Primary Examiner* — Mary Wilczewski
*Assistant Examiner* — Erik T Peterson
(74) *Attorney, Agent, or Firm* — IPUSA, PLLC

(57) ABSTRACT

A plasma etching method is provided for forming a hole using a first processing gas to etch a silicon layer of a substrate to be processed including a silicon oxide film that is formed into a predetermined pattern. The method includes a first depositing step (S11) of depositing a protective film on a surface of the silicon oxide film using a second processing gas containing carbon monoxide gas, a first etching step (S12) of etching the silicon layer using the first processing gas, a second depositing step (S13) of depositing the protective film on a side wall of a hole etched by the first etching step using the second processing gas, and a second etching step (S14) of further etching the silicon layer using the first processing gas. The second depositing step (S13) and the second etching step (S14) are alternately repeated at least two times each.

6 Claims, 18 Drawing Sheets

(51) Int. Cl.
*H01L 21/768* (2006.01)
*H01L 21/308* (2006.01)

(56) References Cited

U.S. PATENT DOCUMENTS

| | | | |
|---|---|---|---|
| 2002/0081854 A1* | 6/2002 | Morrow et al. | 438/694 |
| 2003/0129840 A1* | 7/2003 | Kumar et al. | 438/694 |
| 2004/0192058 A1* | 9/2004 | Chu et al. | 438/710 |
| 2007/0000868 A1* | 1/2007 | Sakai | 216/67 |
| 2007/0202700 A1* | 8/2007 | Leucke et al. | 438/689 |
| 2008/0050919 A1* | 2/2008 | Van Aelst et al. | 438/702 |
| 2009/0035944 A1* | 2/2009 | Chiang et al. | 438/703 |
| 2009/0191711 A1* | 7/2009 | Rui et al. | 438/695 |
| 2010/0105209 A1* | 4/2010 | Winniczek et al. | 438/696 |
| 2010/0267241 A1* | 10/2010 | Riva | 438/706 |
| 2011/0174774 A1* | 7/2011 | Lin et al. | 216/41 |

\* cited by examiner

FIG.18

<TABLE 1>

| STEP NO. | PRESSURE (mTorr) | FIRST HIGH FREQUENCY POWER (W) | SECOND HIGH FREQUENCY POWER (W) | $SF_6$ FLOW RATE (sccm) | $O_2$ FLOW RATE (sccm) | $SiF_4$ FLOW RATE (sccm) | HBr FLOW RATE (sccm) | CO FLOW RATE (sccm) | TIME (SEC) |
|---|---|---|---|---|---|---|---|---|---|
| S10 | 200 | 1000 | 500 | 0 | 350 | 0 | 0 | 0 | 90 |
| S11 | 20 | 2400 | 1000 | 0 | 0 | 0 | 0 | 200 | 60 |
| S12-1 | 150 | 2200 | 0 | 75 | 75 | 300 | 75 | 0 | 40 |
| S12-2 | 135 | 2300 | 0 | 75 | 75 | 300 | 0 | 0 | 40 |
| S13 | 20 | 2400 | 1000 | 0 | 0 | 0 | 0 | 200 | 30 |
| S14-1 | 40 | 1800 | 200 | 0 | 600 | 300 | 250 | 0 | 30 |
| S14-2 | 120 | 2400 | 0 | 75 | 75 | 300 | 75 | 0 | 60 |
| S23 | 20 | 2400 | 1000 | 0 | 0 | 0 | 0 | 200 | 30 |
| S24-1 | 40 | 1800 | 200 | 0 | 600 | 300 | 250 | 0 | 60 |
| S24-2 | 120 | 2550 | 0 | 75 | 75 | 300 | 75 | 0 | 30 |
| S33 | 20 | 2400 | 1000 | 0 | 0 | 0 | 0 | 200 | 30 |
| S34-1 | 40 | 1800 | 200 | 0 | 600 | 300 | 250 | 0 | 30 |
| S34-2 | 120 | 2700 | 0 | 75 | 75 | 300 | 75 | 0 | 30 |
| S43 | 20 | 2400 | 1000 | 0 | 0 | 0 | 0 | 200 | 30 |
| S44-1 | 40 | 1800 | 200 | 0 | 600 | 300 | 250 | 0 | 30 |
| S44-2 | 120 | 2800 | 0 | 75 | 75 | 300 | 75 | 0 | 60 |

FIG.19

<TABLE 2>

| STEP S13 REPETITION NUMBER (TIMES) | 0 | 1 | 2 | 3 | 4 |
|---|---|---|---|---|---|
| EROSION DEPTH D ($\mu$m) | 8 | 6 | 4 | 2 | 0 |

PLASMA ETCHING METHOD

TECHNICAL FIELD

The present invention relates to a plasma etching method for performing an etching process using plasma.

BACKGROUND ART

In the field of semiconductor device manufacturing, numerous efforts have been made to increase the density of semiconductor devices through their miniaturization. Recently, attention is being directed to a semiconductor device stacking technique called three-dimensional (3D) packaging as a means for increasing the density per unit area of semiconductor devices.

Semiconductor devices stacked in the vertical direction may include electrodes that are arranged to penetrate through a substrate including a silicon layer, for example. In this way, the semiconductor devices may be electrically connected via the electrodes. To create such an electrode that penetrates through a substrate, a resist is applied on the substrate using a coater, the resist is exposed using an exposure apparatus, and a resist pattern is developed using a developing apparatus. The resist is then used as a mask to etch the substrate using a plasma etching apparatus to create a hole such as a through hole or a via hole.

For example, when forming a hole such as a through hole in a substrate, plasma etching may have to be performed for a long period of time due to the substantial depth of the hole. On the other hand, as the semiconductor device is miniaturized, the resist film has to be made thinner in order to ensure shape accuracy. However, because the ratio of the silicon layer etching rate to the resist layer etching rate (i.e., selectivity) is not very high, when plasma etching is performed for a long period of time, the mask may be removed before etching is completed.

In this regard, a technique is known that involves using a silicon oxide film as a mask instead of a resist film in the case of forming a hole with a high aspect ratio (depth-to-inner diameter ratio) where the inner diameter is relatively small and the depth is substantially greater (see e.g., Patent Document 1). Because selectivity of the silicon layer to the silicon oxide film is higher than the selectivity of the silicon layer to the resist film, even when plasma etching is performed for a long period of time, the mask may be prevented from being removed before etching is completed.

PRIOR ART DOCUMENTS

Patent Documents

Patent Document 1: Japanese Laid-Open Patent Publication No. 11-97414

SUMMARY OF THE INVENTION

Problem to be Solved by the Invention

In the process of forming a hole in a silicon layer by etching the silicon layer, a silicon oxide film that is formed at a low temperature (low-temperature silicon oxide film) may be used as the mask, for example. The low-temperature silicon oxide film may not be very dense and may have minute lattice defects formed on its surface, for example. When such a silicon oxide film is used as a mask to perform etching using plasma of a processing gas containing fluorine atoms, the minute lattice defects may be locally etched by fluorine radicals (F*) contained in the plasma. As a result, for example, pits may be formed on the surface of the silicon oxide film. When pits are formed on the surface of the silicon oxide film, through holes that penetrate through the silicon oxide film to reach a layer beneath the silicon oxide film may be formed and the silicon oxide film may lose its function as a mask film.

Also, as the aspect ratio of the hole being formed is increased, the opening diameter of a bowing portion that is positioned slightly lower than a top portion of the hole being formed may become larger than the opening diameter at the top portion. Further, at a portion below the bowing portion, the opening diameter may become gradually smaller toward the bottom of the hole, and the opening diameter may be the smallest at the bottom of the hole. As a result, a side wall of the hole may not be arranged to be substantially vertical with respect to the surface of the substrate.

In light of the above problems, it is an object of at least one aspect of the present invention to provide a plasma etching method for forming a hole by etching a silicon layer using a silicon oxide film as a mask, the method enabling a side wall of the hole to be formed in a desirable manner while protecting the mask from plasma.

Means for Solving the Problem

To solve the above problems, the present invention implements the following means.

According to one embodiment of the present invention, a plasma etching method is provided for forming a hole in a silicon layer of a substrate to be processed using a silicon oxide film that is formed into a predetermined pattern on the silicon layer as a mask and etching the silicon layer with plasma of a first processing gas. The plasma etching method includes a first depositing step of depositing a protective film on a surface of the silicon oxide film using plasma of a second processing gas containing carbon monoxide gas, a first etching step of etching the silicon layer with plasma of the first processing gas using the silicon oxide film having the protective film deposited on the surface as a mask, a second depositing step of depositing the protective film on a side wall of a hole etched by the first etching step using plasma of the second processing gas, and a second etching step of further etching the silicon layer with plasma of the first processing gas using the silicon oxide film having the protective film deposited on the surface as a mask. The second depositing step and the second etching step are alternately repeated at least two times each.

Advantageous Effect of the Invention

According to an aspect of the present invention, when forming a hole by etching a silicon layer using a silicon oxide film as a mask, the mask may be protected from plasma and a side wall of the hole may be formed in a desirable manner.

BRIEF DESCRIPTION OF THE DRAWINGS

FIG. 18 is a table indicating processing conditions of each process step of a plasma etching process according to an embodiment of the present invention; and FIG. 19 is a table indicating measurement results of an erosion depth depending on the number of times a process step of the plasma etching process is performed.

EMBODIMENTS FOR IMPLEMENTING THE INVENTION

In the following, embodiments of the present invention are described with reference to the accompanying drawings.

First Embodiment

First, a plasma etching method according to a first embodiment of the present invention is described.

Figure 1:
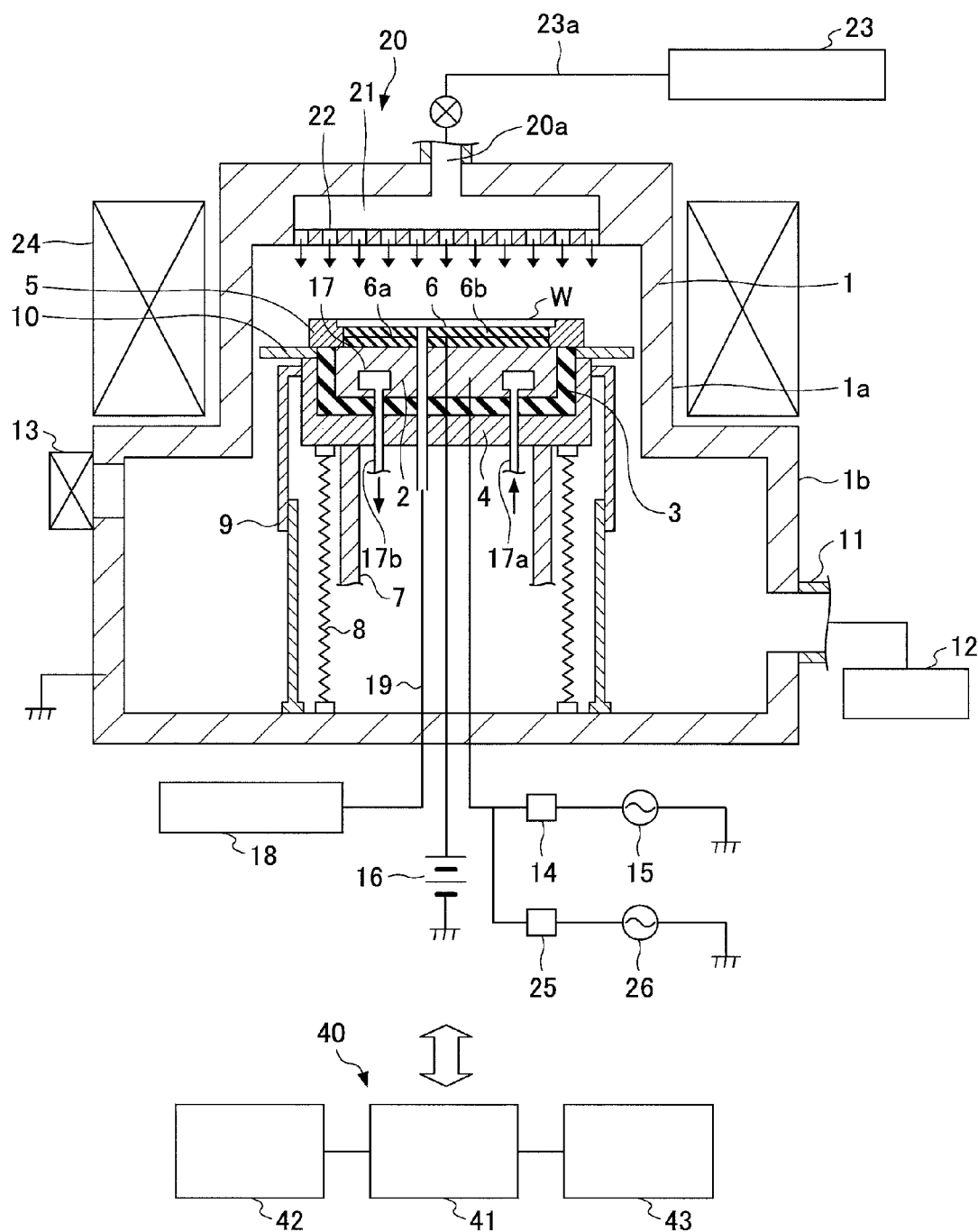
FIG. 1 is a schematic cross-sectional view illustrating a configuration of a plasma etching apparatus for implementing a plasma etching method according to a first embodiment of the present invention.
Figure 2:
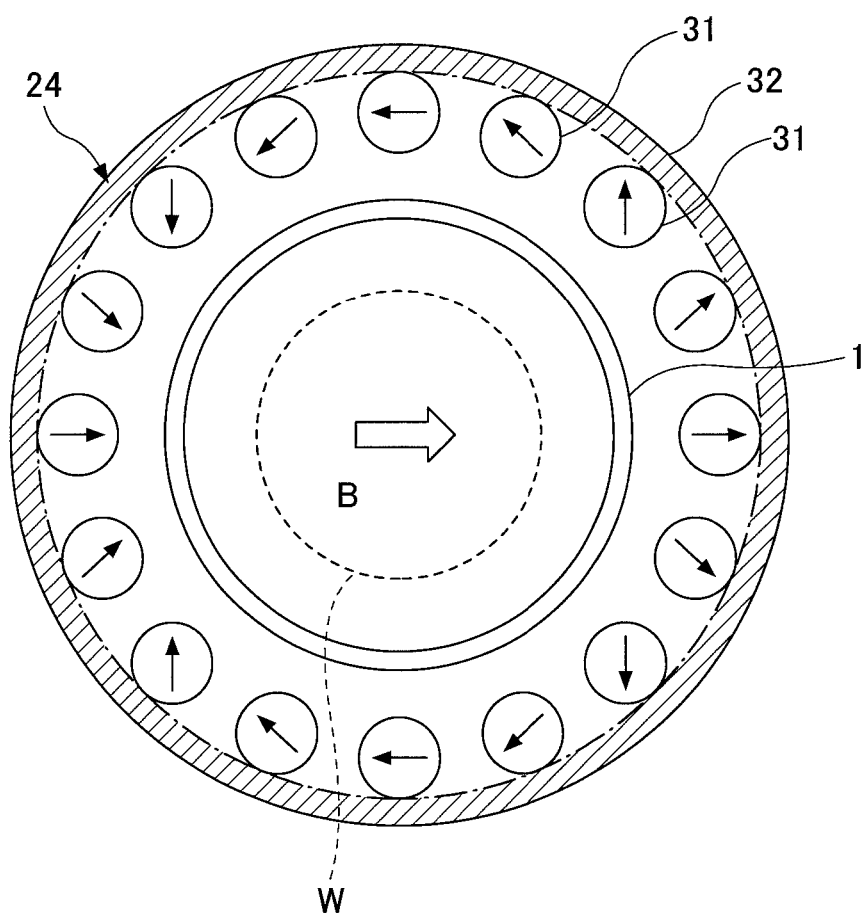
FIG. 2 is a lateral cross-sectional view illustrating a configuration of a dipole ring magnet of the plasma etching apparatus of FIG. 1.
Figure 3:
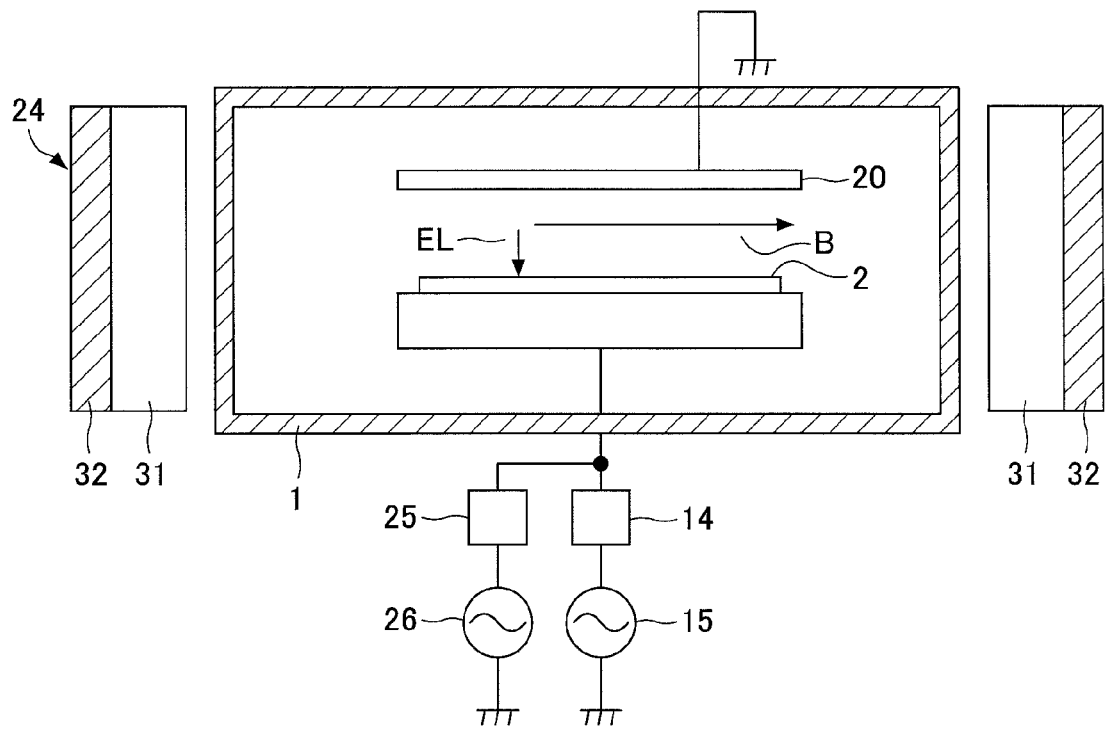
FIG. 3 illustrates an electric field and a magnetic field that are generated within a chamber of the plasma etching apparatus of FIG. 1.
Figure 4:
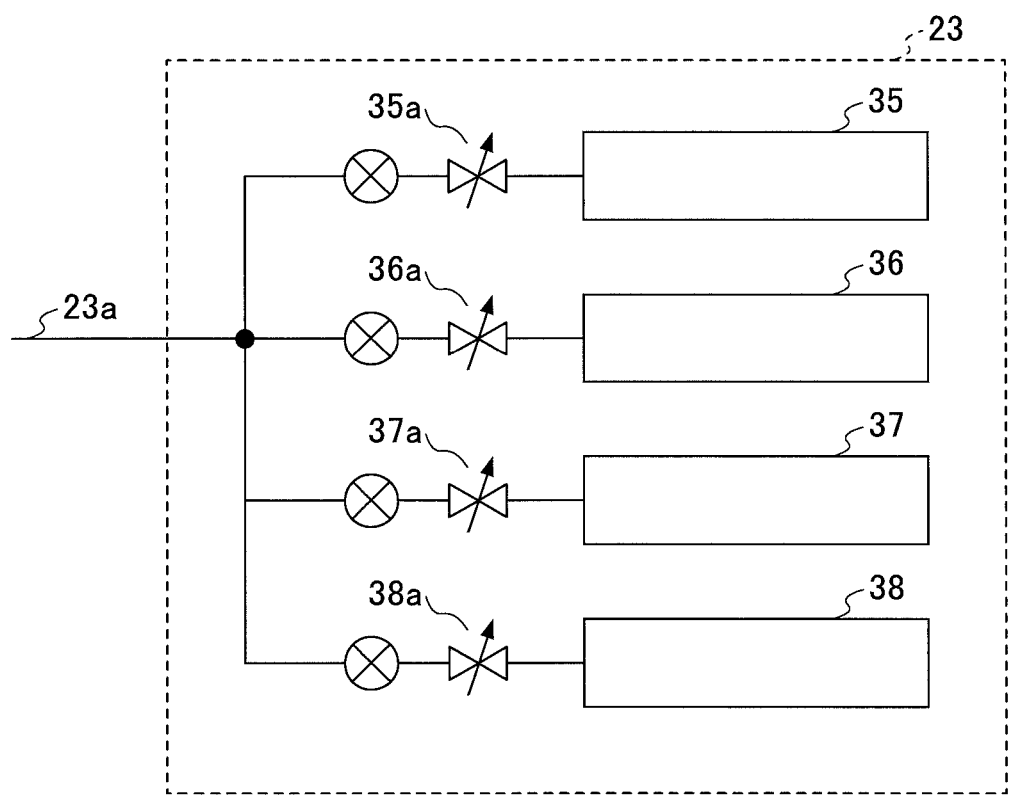
FIG. 4 illustrates a configuration of a processing gas supply part of the plasma etching apparatus of FIG. 1.

FIG. 1 is a schematic cross-sectional view illustrating a configuration of a plasma etching apparatus suitable for implementing the plasma etching method according to the present embodiment. FIG. 2 is a lateral cross-sectional view illustrating a configuration of a dipole ring magnet 24. FIG. 3 illustrates an electric field and a magnetic field that are generated within a chamber 1. FIG. 4 illustrates a configuration of a processing gas supply part 23.

The illustrated plasma etching apparatus corresponds to a reactive ion etching (RIE) type plasma etching apparatus that includes a chamber (processing chamber) 1 that may be made of a metal such as aluminum or stainless steel, for example.

A table or susceptor 2 that is configured to hold an object to be processed such as a silicon wafer W (simply referred to as "wafer W" hereinafter) is arranged inside the chamber 1. The susceptor 2 may be made of aluminum, for example, and is supported by a conductor support 4 via an insulating member 3. A focus ring 5 that may be made of quartz, for example, is arranged along an upper face periphery of the susceptor 2. An electrostatic chuck 6 that holds the wafer W with an electrostatic attraction force is arranged on the upper face of the susceptor 2. The susceptor 2 and the support 4 may be raised and lowered by an elevating mechanism including a ball screw 7. An elevator drive part (not shown) arranged at a lower side of the support 4 is covered by a bellows 8 made of stainless steel. A bellows cover 9 is arranged at the outer side of the bellows 8. A lower face of the focus ring 5 is connected to a baffle plate 10, and the focus ring 5 establishes electrical conduction with the chamber 1 via the baffle plate 10, the support 4, and the bellows 8. The chamber 1 is grounded.

Note that the susceptor 2 and the support 4 correspond to an exemplary embodiment of a support part of the present invention.

The chamber 1 includes an upper part 1a with a smaller diameter and a lower part 1b with a larger diameter than that of the upper part 1a. An exhaust port 11 is formed at a side wall of the lower part 1b of the chamber 1, and an exhaust system 12 is connected to the exhaust port 11 via an exhaust pipe. By activating a vacuum pump of the exhaust system 12, the pressure within the processing chamber 1 may be reduced to a predetermined degree of vacuum. Further, a gate valve 13 that is configured to open/close a loading/unloading port for the wafer W is arranged at the side wall of the lower part 1b of the processing chamber 1.

A first high frequency power supply 15 for plasma generation and reactive ion etching (RIE) is electrically connected to the susceptor 2 via a matching unit 14. The first high frequency power supply 15 may be configured to supply a first high frequency power having a first frequency of 40 MHz, for example, to the lower electrode (i.e., susceptor 2).

A shower head 20, which is maintained at ground potential, is arranged at a ceiling portion of the chamber 1 as an upper electrode (described in detail below). Accordingly, the first high frequency power from the first frequency power supply 15 is supplied between the susceptor 2 and the shower head 20.

A second high frequency power supply 26 is electrically connected in parallel with the first high frequency power supply 15 to the susceptor 2 via a matching unit 25. The second high frequency power supply 26 may be configured to cumulatively supply to the susceptor 2 a second high frequency power having a second high frequency of 3.6 MHz, for example, which is lower than the first high frequency of the first high frequency power supplied by the first high frequency power supply 15. As described below, the second high frequency power from the second high frequency power supply 26 is for preventing generation of side wall roughness at the hole when forming the hole.

The electrostatic chuck 6 includes an electrode 6a made of a conductive film that is arranged between a pair of insulating sheets 6b. A DC power supply 16 is electrically connected to the electrode 6a. When a DC voltage from the DC power supply 16 is applied to the electrode 6a, the electrostatic chuck generates an electrostatic attraction force for attracting the wafer W thereto.

A coolant chamber 17 extending in a circumferential direction, for example, is arranged within the susceptor 2. A coolant such as cooling water at a predetermined temperature may be circulated from an external chiller unit (not shown) to the coolant chamber 17 via pipes 17a and 17b. A processing temperature for the processing of the wafer W placed on the susceptor 2 may be controlled by the temperature of the coolant. The temperature of the susceptor 2 is preferably arranged to be as low as possible such as approximately −30 degrees (° C.), for example, in order to arrange the side wall of a hole being formed through etching to be substantially vertical.

Further, a cooling gas such as He gas from a gas introducing mechanism 18 may be supplied between the upper face of the electrostatic chuck 6 and a backside of the wafer W via a gas supply line 19. The gas introducing mechanism 18 is configured to be capable of individually controlling a gas pressure (i.e., backpressure) of a wafer center portion and a wafer edge portion in order to improve etching in-plane uniformity of the wafer.

The shower head 20 at the ceiling portion has multiple gas discharge ports 22 arranged at its lower face that faces parallel to the upper face of the susceptor 2. A buffer chamber 21 is arranged at the inner side of the gas discharge face of the shower head 20, and a gas supply pipe 23a of the processing gas supply part 23 is connected to a gas introduction port 20a of the buffer chamber 21.

The dipole ring magnet 24 may be arranged to extend annularly or concentrically around the periphery of the upper part 1a of the chamber 1. As illustrated in the cross-sectional view of FIG. 2, the dipole ring magnet 24 includes multiple (e.g., 16) anisotropic segment magnets 31 that are arranged within a casing 32 corresponding to a ring-shaped magnetic member. The anisotropic segment magnets 31 are arranged at fixed intervals along the circumferential direction of the casing 32. Note that the arrows in the anisotropic segment magnets 31 in FIG. 2 indicate magnetization directions. The magnetization direction of the anisotropic segment magnets 31 are incrementally shifted along the circumferential direction as illustrated in FIG. 2 so that the anisotropic segment magnets 31 as a whole generate a horizontal magnetic field B oriented in one direction.

Accordingly, as illustrated in FIG. 3, a RF electrical field EL in a vertical direction is generated by the first high frequency power supply 15, and the horizontal magnetic field B is generated by the dipole ring magnet 24. Such orthogonal electromagnetic field is used to induce a magnetron discharge so that plasma may be generated at a high density near the surface of the susceptor 2.

As the processing gas, a gas mixture of a fluorine compound gas such as sulfur fluoride or carbon fluoride and oxygen ($O_2$) gas may be used, for example. As the fluorine compound gas, a gas having a large number of fluorine within one molecule such as sulfur hexafluoride ($SF_6$) or disulfur decafluoride ($S_2F_{10}$) is preferably used. Also, a silicon fluoride gas such as tetrafluorosilane ($SiF_4$) may be added to the processing gas as a fluorine compound gas. In one example, as illustrated in FIG. 4, the processing gas supply part 23 may include a $SF_6$ gas supply 35, an $O_2$ gas supply 36, and a $SiF_4$ gas supply 37 that respectively have flow rate control valves 35a, 36a, and 37a for individually controlling the flow rates of the respective gases to be supplied.

Further, in the present embodiment, carbon monoxide (CO) gas may be used as a gas for prompting deposition of a protective film on the surface of a mask film. Accordingly, as illustrated in FIG. 4, the processing gas supply part 23 may include a CO gas supply 38 that has a flow rate control valve 38a individually controlling the flow rate of the CO gas being supplied, for example.

Overall operations of the plasma etching apparatus with the above configuration are controlled by a control unit 40. The control unit 40 includes a process controller 41, a user interface 42, and a storage unit 43. The process controller 41 includes a CPU and is configured to control operations of various components of the plasma etching apparatus.

The user interface 42 may include a keyboard that may be operated by a process controller to input various commands for controlling the process of the plasma etching apparatus, and a display that may indicate the operation status of the plasma etching apparatus in visual form, for example.

The storage unit 43 stores recipes that include control programs (software) for enabling the process controller 41 to control various process operations of the plasma etching apparatus and process condition data, for example. The process controller 41 reads a given recipe from the storage unit 43 according to a command from the user interface 42 to execute a desired process at the plasma etching apparatus. In this way, the plasma etching apparatus may perform the desired process under control by the control processor 41. In certain embodiments, the recipes including the control programs and process condition data may be stored in a computer-readable storage medium (e.g., hard disk, CD, flexible disk, semiconductor memory). In other embodiments, the recipes including the control programs and process condition data may be transmitted from another device via a dedicated line, for example.

To perform plasma etching within the plasma etching apparatus having the above configuration, first, the gate valve 13 is opened to introduce a wafer W including a silicon layer as a substrate to be processed into the chamber 1 and place the wafer W on the susceptor 2. Then, the susceptor 2 having the wafer W placed thereon is raised to a height level as shown in FIG. 1, and air is evacuated out of the chamber 1 via the exhaust port 11 by the vacuum pump of the exhaust system 12. Then, the processing gas supply part 23 introduces a processing gas into the chamber 1 at a predetermined flow rate, and the pressure within the chamber 1 is set to a predetermined value. Further, the first high frequency power supply 15 supplies a predetermined high frequency power to the susceptor 2. Also, the DC power supply 16 applies a DC voltage to the electrode 6a of the electrostatic chuck 6 to fix the wafer W to the susceptor 2. The processing gas discharged from the shower head 20 is turned into plasma through magnetron discharge, and the generated plasma is irradiated on the wafer W. In turn, the wafer W may be etched by the radicals and ions included in the irradiated plasma.

In the following, a plasma etching method according to the present embodiment is described.

Figure 5:
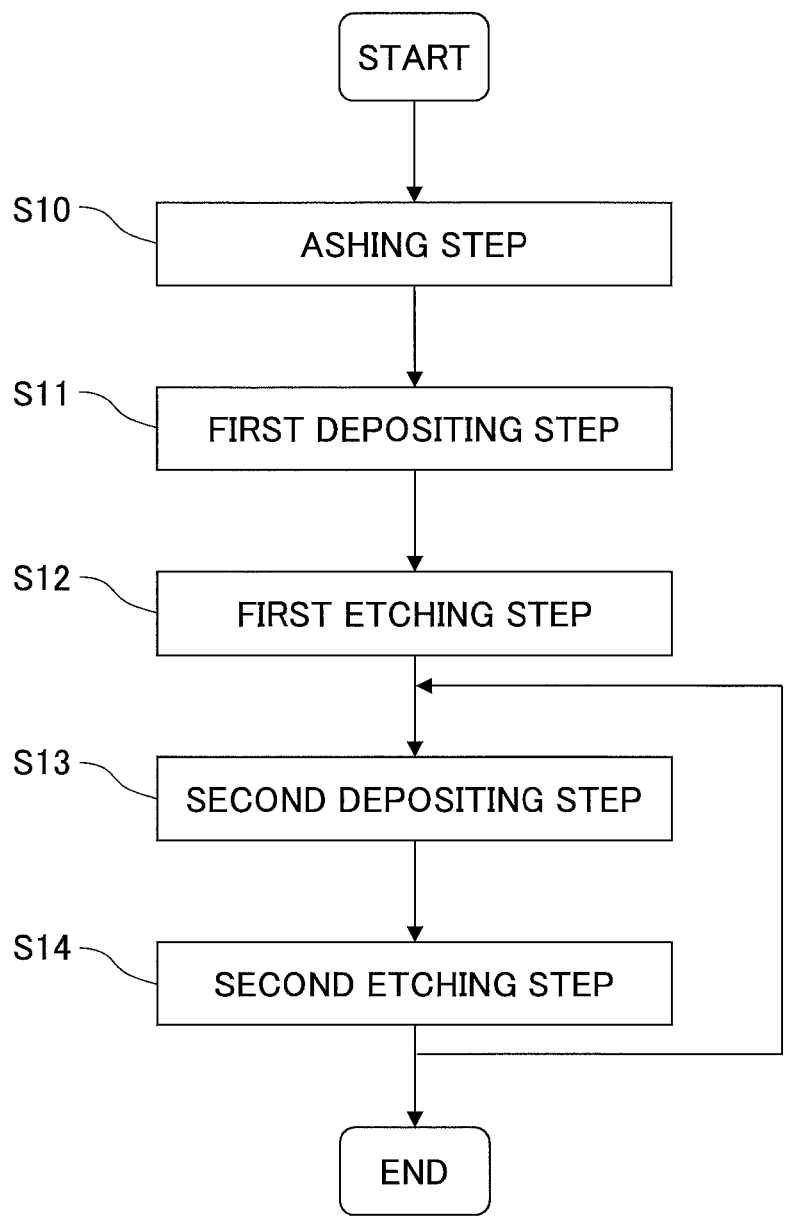
FIG. 5 is a flowchart illustrating process steps of the plasma etching method according to the first embodiment.

FIG. 5 is a flowchart illustrating process steps of the plasma etching method according to the present embodiment. FIGS. 6-14 are cross-sectional views illustrating states of the wafer W at various process steps of the plasma etching method according to the present embodiment. Note that FIGS. 6-14 are enlarged partial views of a region near an opening portion formed at the wafer W.

Figure 6:
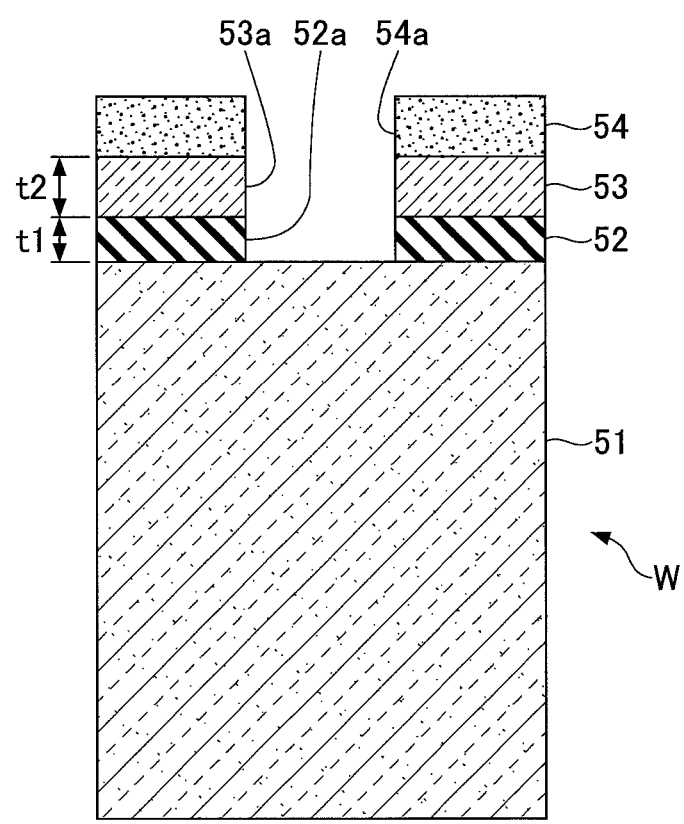
FIG. 6 is a cross-sectional view illustrating a state of a wafer in a process step of the plasma etching method according to the first embodiment.

First, a configuration of the wafer W subject to processing by the plasma etching method of the present embodiment is described. As illustrated in FIG. 6, the wafer W includes a base substrate 51 that may be made of a single crystal silicon (Si) layer (also referred to as "silicon layer 51" hereinafter), a first mask film 52, a second mask film 53, and a resist film 54 that are layered in this order. The first mask film 52 may be a silicon nitride (SiN) film having a thickness t1. The thickness t1 may be 0.5 μm, for example. The second mask film 53 may be a silicon oxide (SiOx) film having a thickness t2. The thickness t2 may be 0.5 μm, for example.

Note that in an alternative embodiment, the first mask film 52 may be made of a silicon oxide (SiOx) film and the second mask film 53 may be made of a silicon nitride (SiN) film. Also, the uppermost layer of the mask films is not limited to a silicon oxide (SiOx) film or a silicon nitride (SiN) film, but may be made of other various types of insulating films or inorganic films.

In the descriptions below, the term "silicon oxide film" is used to refer to a film made of a silicon oxide as well as a film made of a silicon-based oxide including silicon as a main component.

The resist film 54 may be subject to a photolithography process beforehand so that a plurality of circular opening portions 54a may be formed thereon as a resist pattern. The wafer W having the above-described layer configuration may be introduced into the chamber 1 where plasma etching as described below is to be performed and placed on the susceptor 2. Alternatively, the wafer W may be introduced into a different chamber from the chamber 1. In the example described below, it is assumed that the wafer W is introduced into the chamber 1 where plasma etching is to be performed.

After air is evacuated from the chamber 1 by the vacuum pump of the exhaust system 12, a processing gas is introduced into the chamber 1 at a predetermined flow rate by the processing gas supply part 23, and the pressure within the chamber 1 is controlled to a predetermined value. In the present example, $SF_6$ gas and $O_2$ gas are supplied at predetermined flow rates as the processing gas. Also, silicon fluoride ($SiF_4$) gas and hydrogen bromide (HBr) gas may be added to processing gas as is necessary or desired. Note that the wafer W is electrostatically attracted to the susceptor 2 by the DC power supply 16, and in this state, the first high frequency power supply 15 applies a first high frequency power to the susceptor 2. As a result, the processing gas discharged from the shower head 20 turns into plasma through magnetron discharge, and the generated plasma is irradiated on the wafer W.

As illustrated in FIG. 6, by irradiating the plasma on the wafer W, opening portions 53a and 52a are respectively formed on the second mask film 53 and the first mask film 52 at the position corresponding to the opening portion 54a of the resist film 54.

Referring to FIG. 5, first, in step S10, the wafer W having its surface arranged into a state as illustrated in FIG. 6 is subject to an ashing process that may involve removing the resist film 54 with plasma generated from a processing gas including $O_2$ gas, for example.

In this step, for example, after evacuating air from the chamber 1 by the vacuum pump of the exhaust system 12, a processing gas is introduced into the chamber 1 at a predetermined flow rate by the processing gas supply part 23, and the pressure within the chamber 1 is controlled to a predetermined value. In the present example, $O_2$ gas is supplied at a predetermined flow rate as the processing gas. Also, the wafer W is electrostatically attracted to the susceptor 2 by the DC power supply 16, and in this state, the first high frequency power supply 15 applies a first high frequency power to the susceptor 2. As a result, the processing gas discharged from the shower head 20 turns into plasma through magnetron discharge, and the generated plasma is irradiated on the wafer W.

Figure 7:
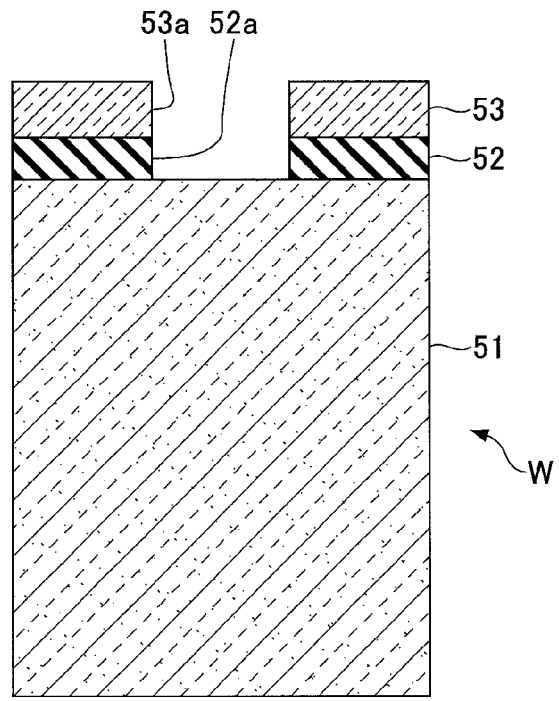
FIG. 7 is a cross-sectional view illustrating a state of a wafer in another process step of the plasma etching method according to the first embodiment.

By irradiating the plasma on the wafer W, the resist film 54 may be burnt (ashed) and removed as illustrated in FIG. 7. Note that in certain embodiments, the resist film 54 does not necessarily have to be completely removed to expose the surface of the second mask film 53 in step S10. That is, in some embodiments, the resist film 54 on the second mask film 53 may be completely removed and the surface of the second mask film 53 may be cleaned in the next step S11.

Next, in step S11, after the ashing process on the resist film 54 is completed, a protective film 55 is deposited using plasma generated from a processing gas containing carbon monoxide (CO) gas (first depositing step).

In this step, for example, after evacuating air from the chamber 1 by the vacuum pump of the exhaust system 12, a processing gas is introduced into the chamber 1 at a predetermined flow rate by the processing gas supply part 23, and the pressure within the chamber 1 is controlled to a predetermined value. In the present example, CO gas is supplied at a predetermined flow rate as the processing gas. Also, the wafer W is electrostatically attracted to the susceptor 2 by the DC power supply 16, and in this state, the first high frequency power supply 15 applies a first high frequency power to the susceptor 2. As a result, the processing gas discharged from the shower head 20 turns into plasma through magnetron discharge, and the generated plasma is irradiated on the wafer W.

Figure 8:
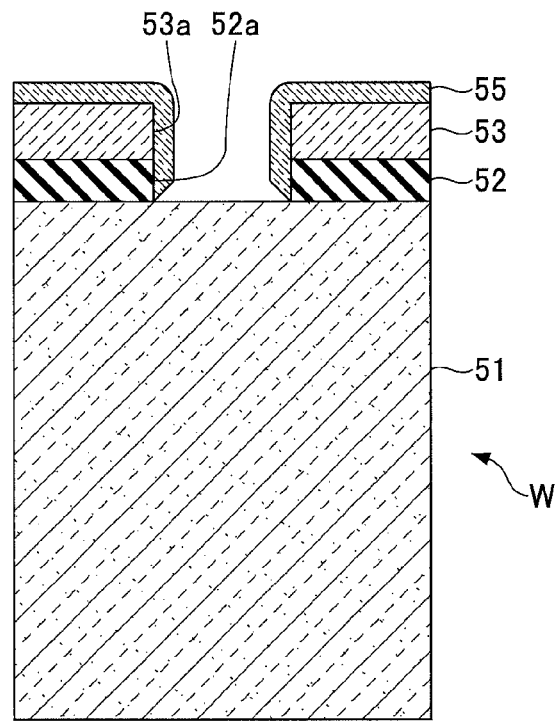
FIG. 8 is a cross-sectional view illustrating a state of a wafer in another process step of the plasma etching method according to the first embodiment.

By irradiating the plasma on the wafer W, the protective film 55 may be deposited on the surface of the second mask film 53 as illustrated in FIG. 8. Note that the protective film 55 is also deposited on the side face of the opening portion 53a of the second mask film 53 and the side face of the opening portion 52a of the first mask film 52.

In the case where CO gas is used as the processing gas in step S11, for example, carbon radicals C* may be generated when the processing gas is turned into plasma. When the generated carbon radicals C* reaches the surface of the second mask film 53, a material containing carbon such as amorphous carbon may be deposited. In the present embodiment, the deposited material may function as a protective film in the subsequent etching step, which is described below.

As described below, in the first depositing step, carbon radicals C* are preferably generated while fluorine radicals F* are preferably not generated. Accordingly, in an alternative embodiment, carbon dioxide ($CO_2$) gas may be used in place of CO gas as the processing gas.

Also, in the case where the resist film 54 is not completely removed to expose the surface of the second mask film 53 in step S10, the remaining resist layer 54 may be removed with plasma in step S11. In this case, when the carbon radicals C* reach the surface of the second mask film 53, the remaining resist layer 54 may be ashed and removed while a material containing carbon is deposited on the surface of the second mask film 53.

In an alternative embodiment, the ashing process using plasma generated from a processing gas including $O_2$ gas of step S10 may be omitted, and the plasma etching process may be started from step S11. That is, in some embodiments, the entire resist film 54 may be removed by plasma generated from a processing gas containing CO gas.

Next, in step S12, the mask film 53 having the protective film 55 deposited on its surface is used as a mask to etch the silicon layer 51 with plasma generated from a processing gas containing $SF_6$ gas (first etching step).

In this step, for example, after evacuating air from the chamber 1 by the vacuum pump of the exhaust system 12, a processing gas is introduced into the chamber 1 at a predetermined flow rate by the processing gas supply part 23, and the pressure within the chamber 1 is controlled to a predetermined value. In the present example, $SF_6$ gas and $O_2$ gas are supplied at predetermined flow rates as the processing gas. Also, silicon fluoride ($SiF_4$) gas and hydrogen bromide (HBr) gas may be added to processing gas as is necessary or desired. The wafer W is electrostatically attracted to the susceptor 2 by the DC power supply 16, and in this state, the first high frequency power supply 15 applies a first high frequency power to the susceptor 2. As a result, the processing gas discharged from the shower head 20 turns into plasma through magnetron discharge, and the generated plasma is irradiated on the wafer W.

Figure 9:
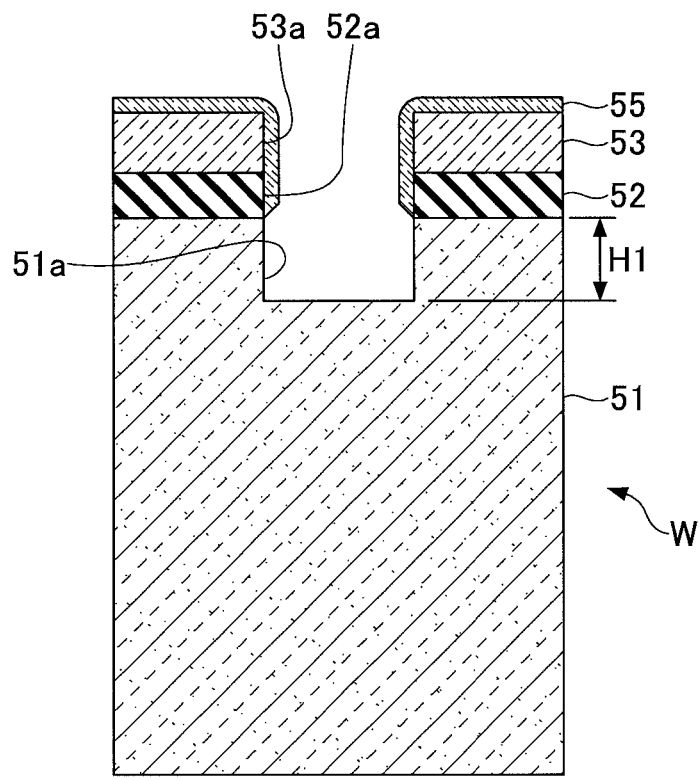
FIG. 9 is a cross-sectional view illustrating a state of a wafer in another process step of the plasma etching method according to the first embodiment.

By irradiating the plasma on the wafer W, a hole 51a having a first depth H1 may be formed at the lower side silicon layer 51 at the position corresponding to the opening portions 53a and 52a of the second mask film 53 and the first mask film 52 as illustrated in FIG. 9.

In the case where $SF_6$ gas is used as the processing gas, for example, fluorine radicals F* may be generated when the processing gas is turned into plasma. When the generated fluorine radicals F* reach the silicon layer 51, the fluorine radicals F* may react with Si, and $SiF_4$ may be generated as illustrated by reaction formula (1) shown below.

$$4F^* + Si \rightarrow SiF_4 \quad (1)$$

Then, the generated $SiF_4$ may be discharged and the silicon layer 51 may be etched as a result.

Next, in step S13, the protective film 55 is deposited on the side face of the hole 51a using plasma generated from a processing gas containing CO gas (second depositing step).

In this step, for example, after evacuating air from the chamber 1 by the vacuum pump of the exhaust system 12, the processing gas is introduced into the chamber 1 at a predetermined flow rate by the processing gas supply part 23, and the pressure within the chamber 1 is controlled to a predetermined value. In the present example, CO gas is supplied at predetermined flow rate as the processing gas. Also, the wafer W is electrostatically attracted to the susceptor 2 by the DC power supply 16, and in this state, the first high frequency power supply 15 applies a first high frequency power to the susceptor 2. As a result, the processing gas discharged from the shower head 20 turns into plasma through magnetron discharge, and the generated plasma is irradiated on the wafer W.

Figure 10:
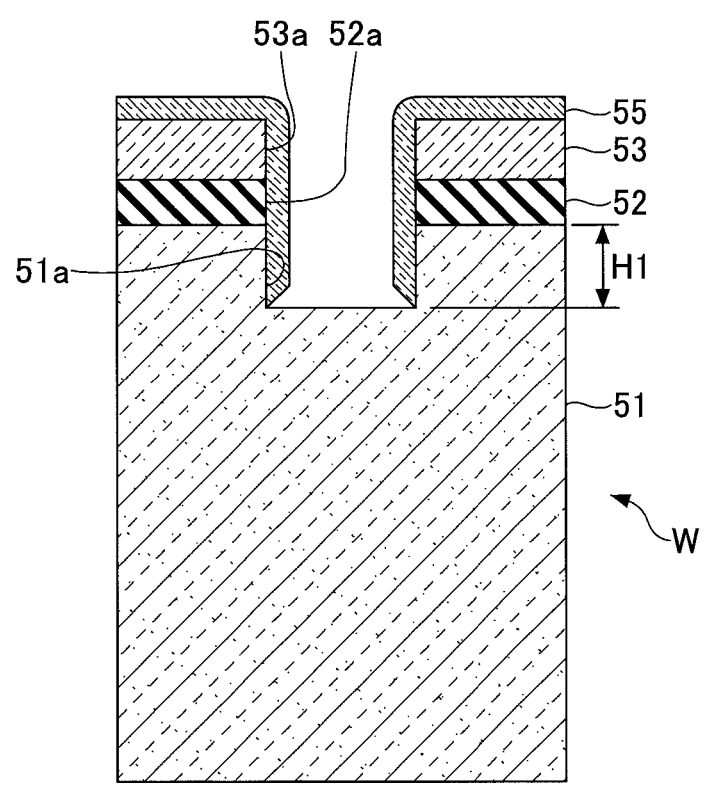
FIG. 10 is a cross-sectional view illustrating a state of a wafer in another process step of the plasma etching method according to the first embodiment.

By irradiating the plasma on the wafer W, the protective film 55 may be deposited on the side face of the hole 51a as illustrated in FIG. 10. Note that the protective film 55 is also deposited on the top surface of the second mask film 53, the side face of the opening portion 53a of the second mask film 53, and the side face of the opening portion 52a of the first mask film 52.

In the case where CO gas is used as the processing gas, for example, carbon radicals C* may be generated when the processing gas is turned into plasma as in step S11. When the generated carbon radicals C* reach the surface of the second mask film 53, a material containing carbon such as amorphous carbon may be deposited on the surface of the second mask film 53. In the present embodiment, the deposited material may act as a protective film while an etching step is performed.

Also, for example, as the reaction of formula (1) progresses in step S12, or in a case where a processing gas containing $SiF_4$ gas is used, silicon radicals Si* may be generated when $SiF_4$ gas is turned into plasma. Accordingly, for example, in the case where a processing gas containing CO gas is used in step S13, the carbon radicals C* generated when the processing gas is turned into plasma may react with the silicon radicals Si* and a material including Si—C bonds may be deposited. In this case, such deposited material may also act as a protective film while an etching step is performed.

Note that in step S13, the protective film 55 may be deposited on the side wall of the hole 51a to extend down to the bottom of the hole 51a. In this way, when etching the bottom face of the hole 51a, the side wall of the hole 51a may be prevented from being etched all the way down to the bottom of the hole 51a, for example.

Next, in step S14, the second mask film 53 having the protective film 55 deposited on its surface is used as a mask to etch the silicon layer 51 with plasma generated from a processing gas containing $SF_6$ gas (second etching step).

In this step, for example, after evacuating air from the chamber 1 by the vacuum pump of the exhaust system 12, a processing gas is introduced into the chamber 1 at a predetermined flow rate by the processing gas supply part 23, and the pressure within the chamber 1 is controlled to a predetermined value. In the present example, $SF_6$ gas and $O_2$ gas are supplied at predetermined flow rates as the processing gas. Also, silicon fluoride ($SiF_4$) gas and hydrogen bromide (HBr) gas may be added to processing gas as is necessary or desired. The wafer W is electrostatically attracted to the susceptor 2 by the DC power supply 16, and in this state, the first high frequency power supply 15 applies a first high frequency power to the susceptor 2. As a result, the processing gas discharged from the shower head 20 turns into plasma through magnetron discharge, and the generated plasma is irradiated on the wafer W.

Figure 11:
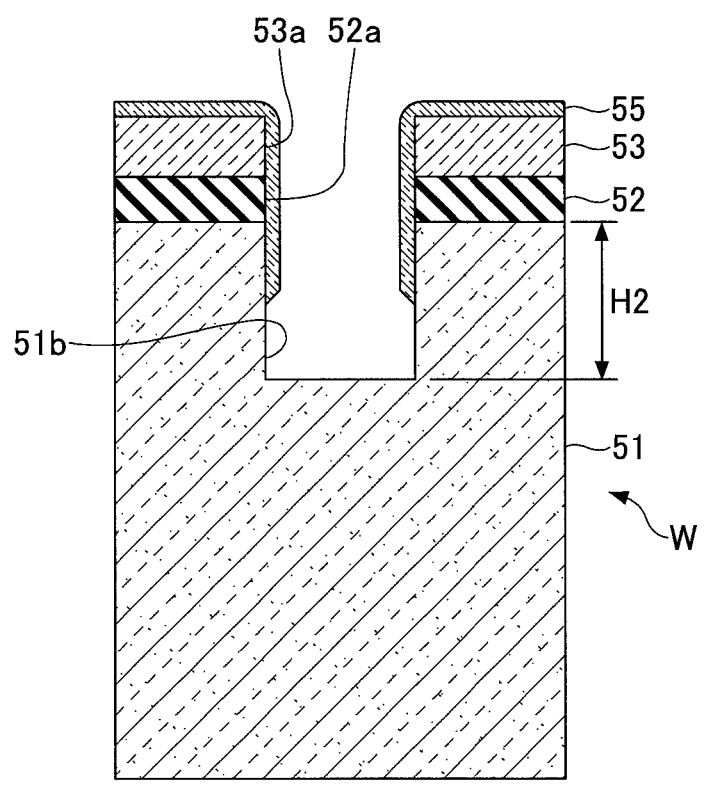
FIG. 11 is a cross-sectional view illustrating a state of a wafer in another process step of the plasma etching method according to the first embodiment.

By irradiating the plasma on the wafer W, a hole 51b with a second depth H2 may be formed at the lower side silicon layer 51 at the position corresponding to the opening portions 53a and 52a of the second mask film 53 and the first mask film 52 as illustrated in FIG. 11.

Note that in step S14, before etching the silicon layer 51 with the plasma generated from the processing gas containing $SF_6$ gas, a second protective film may be deposited on the side wall of the hole 51a formed in the first etching step (S12) with plasma generated from the processing gas containing $SF_6$ gas and $O_2$ gas. In this case, oxygen radicals O* and silicon fluoride radicals SiFx* may be generated when the processing gas is turned into plasma. In turn, for example, the oxygen radicals O* may react with the silicon fluoride radicals SiFx* to prompt the deposition of the second protective film.

In the present embodiment, step S13 (second depositing step) and step S14 (second etching step) are alternately repeated at least two times each.

Figure 12:
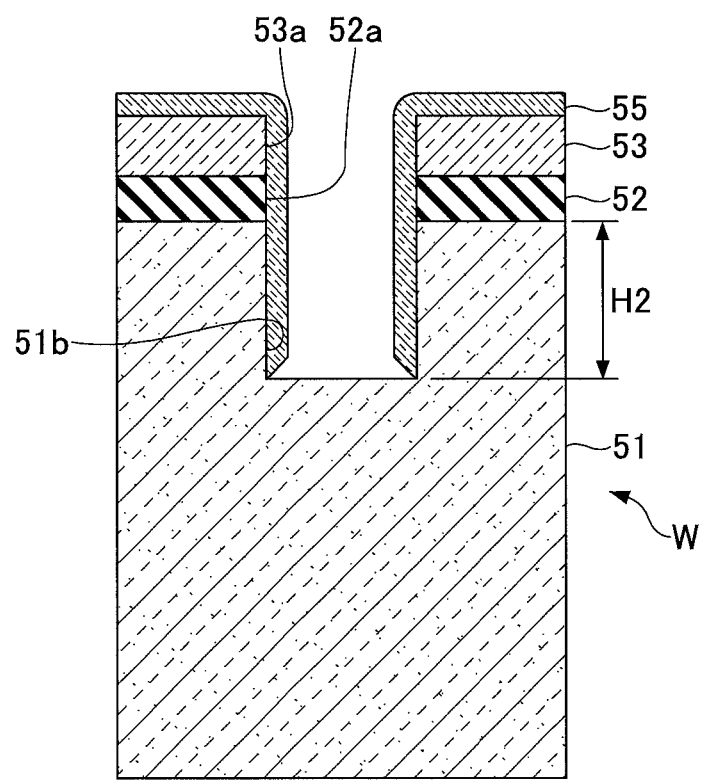
FIG. 12 is a cross-sectional view illustrating a state of a wafer in another process step of the plasma etching method according to the first embodiment.

In step S13 that is performed a second time, as in step S13 that is performed the first time, the protective film 55 is deposited on the side wall of the hole 51b formed at the silicon layer 51 using plasma generated from a processing gas containing CO gas (second depositing step). In this way, the protective film 55 may be deposited on the side wall of the hole 51b as illustrated in FIG. 12. Note that the protective film 55 is also deposited on the top surface of the second mask film 53, the side face of the opening portion 53a of the second mask film 53, and the side face of the opening portion 52a of the first mask film 52. The protective film 55 may also be deposited on the side wall of the hole 51b down to the bottom of the hole 51b.

Figure 13:
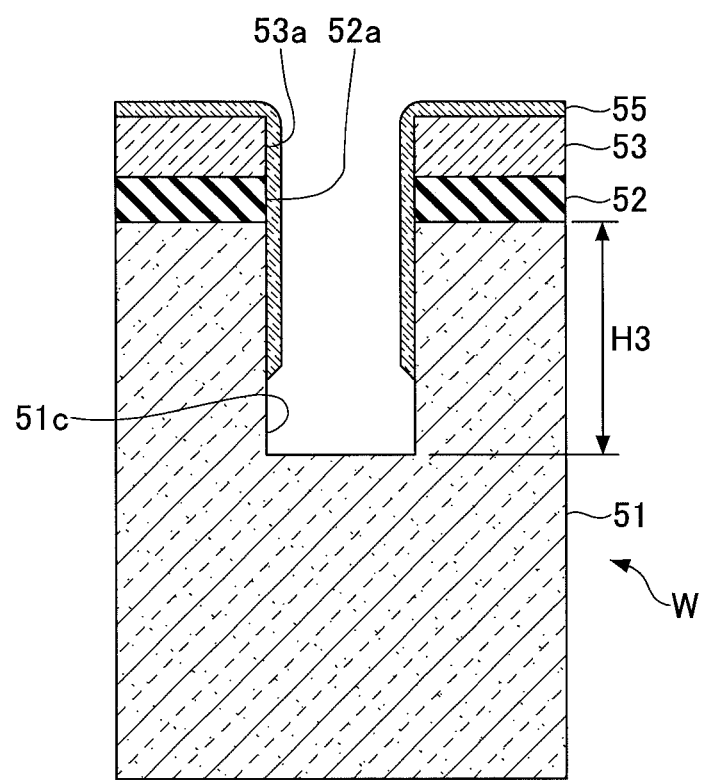
FIG. 13 is a cross-sectional view illustrating a state of a wafer in another process step of the plasma etching method according to the first embodiment.

In step S14 that is performed a second time, as in step S14 that is performed the first time, the second mask film 53 having the protective film 55 deposited on its surface is used as a mask to etch the silicon layer 51 with plasma generated from a processing gas containing $SF_6$ gas (second etching step). In this way, a hole 51c with a third depth H3 may be formed at the lower side silicon layer 51 at the position corresponding to the opening portions 53a and 52a of the second mask film 53 and the first mask film 52 as illustrated in FIG. 13.

Figure 14:
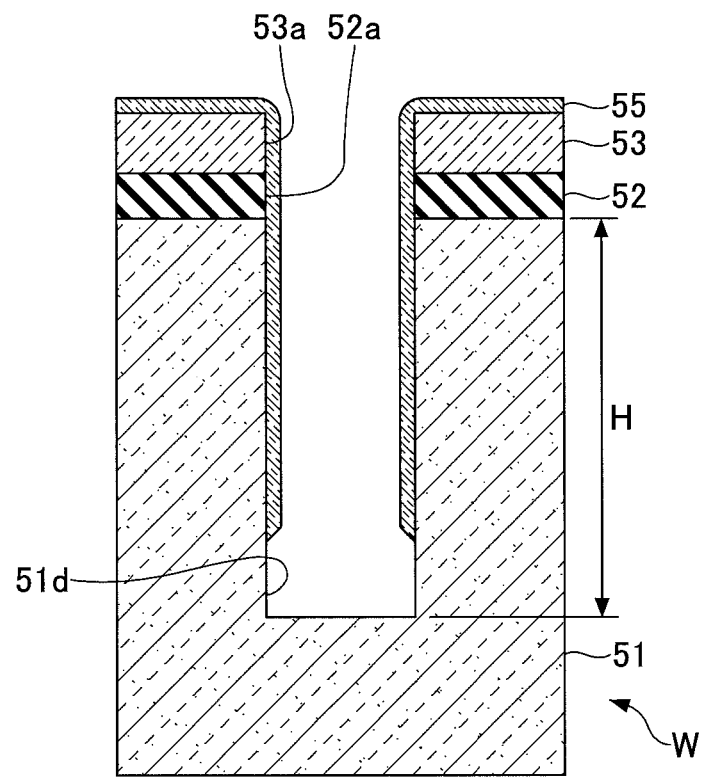
FIG. 14 is a cross-sectional view illustrating a state of a wafer in another process step of the plasma etching method according to the first embodiment.

By alternately repeating steps S13 and S14 thereafter, a hole 51d with a desired depth H may be formed at the lower side silicon layer 51 as illustrated in FIG. 14. According to an aspect of the present embodiment, by alternately repeating steps S13 and S14, the mask film may be protected from plasma, and the side wall of the hole being formed may be arranged to be substantially vertical with respect to the surface of the substrate.

Note that in the present embodiment, the dipole ring magnet 24 applies the horizontal magnetic field B to a region near the wafer surface. When the magnitude of a magnetic field near the wafer surface is increased, the radius of the circular motion of electrons around the magnetic field lines (Larmor radius) becomes smaller. That is, the electrons near the wafer surface remain tied to the region near the wafer surface, and as a result, the electron density near the wafer surface increases. Also, the plasma density near the wafer surface increases as well. In this way, the etching rate of the silicon layer 51 may be increased.

In a preferred embodiment, the value of the first high frequency power supplied in step S12 (first etching step) may be incrementally increased while etching the silicon layer 51, for example. Also, the value of the first high frequency power supplied in step S14 (second etching step) may be increased every time step S14 is alternately repeated with step S13, for example. Table 1 shown in FIG. 18 illustrates exemplary process steps of a first working example of the above embodiment.

Note that steps S12-1 and S12-2 of Table 1 correspond to step S12 described above. Also, steps S13, S23, S33, and S43 of Table 1 respectively correspond to the above step S13 performed a first time, a second time, a third time, and a fourth time. Steps S14-2, S24-2, S34-2, and S44-2 of Table 1 respectively correspond to the above step S14 performed a first time, a second time, a third time, and a fourth time.

Steps S14-1, S24-1, S34-1, and S44-1 of Table 1 respectively correspond to the above step S14 performed a first time, a second time, a third time, and a fourth time for depositing the protective film 55 before etching the silicon layer 51.

In the first working example, the first high frequency power is set equal to 2200 W in step S12-1, and the first high frequency power is set equal to 2300 W in step S12-2. That is, the first high frequency power being supplied is incrementally increased. By incrementally increasing the first high frequency power supplied in step S12, energy of the plasma may be increased as the etching progresses, for example. In this way, radicals necessary for etching may be arranged to reach the bottom of the hole in respect of an increase in hydrogen $H_2$ over time.

In the first working example, the first high frequency power is set equal to 2400 W in step S14-2, the first high frequency power is set equal to 2550 W in step S24-2, the first high frequency power is set equal to 2700 W in step S34-2, and the first high frequency power is set equal to 2800 W in step S44-2. That is, the value of the first high frequency power supplied in steps S14-2 through S44-2 is incrementally increased each time step S14 is alternately repeated with step S13. By incrementally increasing the value of the first high frequency power supplied in steps S14-2 through S44-2, an adequate amount of radicals may be supplied to the bottom of the hole being formed. Thus, in transferring the shape of the opening portion 53a of the second mask film 53 and the opening portion 52a of the first mask film 52 to the hole to be formed at the silicon layer 51, the shape of the hole may be prevented from becoming irregular or distorted, for example.

By performing the above process steps, etching of the silicon layer 51 may be completed, and the hole 51d with the desired depth H may be formed as illustrated in FIG. 14.

In the following, aspects of the present embodiment are explained with reference to a comparative example. By implementing the plasma etching method of the present embodiment, the mask may be protected from plasma and the side wall of the hole being formed may be arranged to be substantially vertical with respect to the surface of the wafer.

Figure 15:
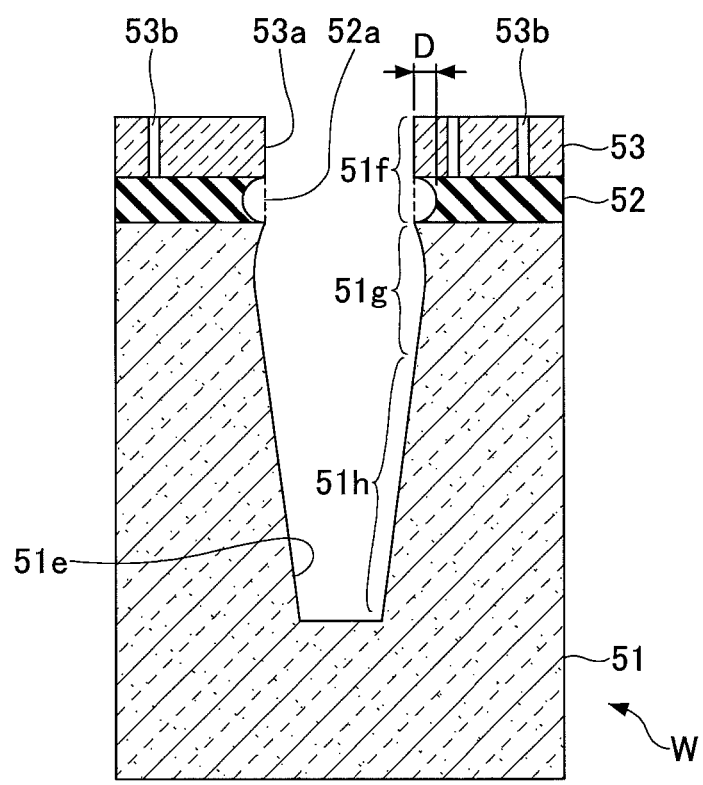
FIG. 15 is a cross-sectional view illustrating a state of a wafer in a process step of a plasma etching method according to a comparative example.

FIG. 15 is a cross-sectional view schematically illustrating a state of a wafer W that is subject to a plasma etching method according to the comparative example.

In the process of etching a silicon layer according to the comparative example, for example, steps S11, S13, S23, S33, S43 of Table 1 are omitted.

When forming a hole 51e with a high aspect ratio as illustrated in FIG. 15, for example, the second mask film 53 including a silicon oxide film or some other silicon-based oxide film that is arranged into a pattern may be used as a mask to etch the silicon layer 51. Because the selectivity of a silicon layer with respect to a silicon oxide film is higher than the selectivity of a silicon layer with respect to a resist film, the mask may be prevented from being removed even when plasma etching is performed for a long period of time.

However, in the process of etching a silicon layer to form a hole, a silicon oxide film that is formed at a low temperature may be used as the second mask film 53 due to processing temperature restrictions, for example. A silicon oxide film that is formed at a low temperature may not be very dense and may have minute lattice defects formed on its surface. When such a silicon oxide film is used as the second mask film 53 to perform plasma etching with plasma generated from a processing gas containing fluorine atoms, the minute lattice defects may be locally etched by the fluorine radicals F* contained in the plasma. In turn, pits may be formed on the surface of the second mask film 53. When pits are formed on the surface of the second mask film 53, through holes 53b that penetrate through the second mask film 53 may be formed at the second mask film 53, and the second mask film 53 may thus lose its function as a mask film.

Also, as the aspect ratio of the hole 51e is increased, the opening diameter of a bowing portion 51g positioned slightly lower than an upper portion 51f may become greater than the opening diameter of the upper portion 51f. Further, at a portion 51h below the bowing portion 51g, the opening diameter may gradually become smaller toward the bottom of the hole 51e such that the bottom of the hole 51e has the smallest diameter. As a result, the side wall of the hole 51e may be not arranged substantially vertical to the surface of the wafer W.

Also, when the silicon layer 51 is etched using the above reaction formula (1), $SiF_4$ is generated inside the hole 51e, and the generated $SiF_4$ needs to be discharged outside the hole 51e. However, when the aspect ratio of the hole 51e to be formed is high and the etching rate for etching the silicon layer 51 is several tens of micrometers per minute (μm/min), a relatively large amount of $SiF_4$ may be generated and the amount of fluorine radicals F* supplied within the hole 51e and the amount of to the reaction product $SiF_4$ discharged outside the hole 51e may be substantially equal. Thus, the partial pressure of $SiF_4$ within the hole 51e may be increased and the partial pressure of the fluorine radicals F* may be prevented from increasing. As a result, the silicon layer 51 etching rate may not be adequately increased.

On the other hand, in etching the silicon layer 51 using the second mask film 53 as a mask according to the plasma etching method of the present embodiment, a processing gas containing CO gas is used to deposit a protective film 55 on the second mask film 53 so that the surface of the second mask film 53 is not exposed. Thus, when etching of the silicon layer 51 is performed using a processing gas containing fluorine atoms, the minute lattice defects formed on the surface of the second mask film 53 may be prevented from being locally etched and the generation of pits on the surface of the second mask film 53 may be prevented.

Also, because the processing gas containing CO gas that is used for depositing the protective film 55 does not contain fluorine atoms, the minute lattice defects formed on the surface of the second mask film 53 may be prevented from being locally etched and pits may be prevented from being formed on the surface of the second mask film 53.

Thus, through holes 53b penetrating through the second mask film 53 may be prevented from being generated, and the second mask film 53 and the first mask film 52 may be protected from plasma.

Also, because the processing gas containing CO gas is used to deposit the protective film 55 on the side wall of the hole 51d in the present embodiment, even when the depth of the hole 51d being formed increases as the etching progresses, the side wall of the hole 51d may be prevented from being etched laterally. Thus, a bowing portion may be prevented from being created at the hole 51d. Also, the opening diameter of the hole 51d may be prevented from becoming smaller toward the bottom of the hole 51d and the side wall of the hole 51d may be arranged to be substantially vertical with respect to the surface of the wafer W.

Further, because the side wall of the hole 51d may be prevented from being etched in the present embodiment, even when the aspect ratio of the hole 51d being formed is high, the amount of $SiF_4$ generated within in the hole 51d may be reduced. In this way, the partial pressure of $SiF_4$ within the hole 51d may be prevented from increasing and the partial pressure of fluorine radicals F* within the hole 51d may be increased. As a result, the silicon layer 51 etching rate may be increased.

In an experiment, in the plasma etching process of Table 1 that involves alternately repeating steps S13 (second depositing step) and S14 (second etching step) four times after performing steps S10 through S12-2, step S13 was omitted at least once before performing step S14, and an erosion depth D (see FIG. 15) of the side walls of the opening portions 52a and 53a of the first mask film 52 and the second mask film 53 resulting from the lateral etching of the side walls was measured in each case where step S13 was performed for a total of zero times, one time, two times, three times, and four times. Table 2 of FIG. 19 represents the measurement results obtained from the above experiment.

As indicated in Table 2, the erosion depth D decreases as the number of times step S13 is performed increases. Thus, it can be appreciated from the above experimental results that by depositing a protective film using plasma generated from a processing gas containing CO gas according to the present embodiment, the mask film may be prevented from being etched laterally and the side wall may be protected from erosion.

Second Embodiment

In the following, a plasma etching method according to a second embodiment of the present invention is described.

The plasma etching method according to the second embodiment may be implemented using a plasma etching apparatus similar to the plasma etching apparatus used in the first embodiment. Accordingly, descriptions of the plasma etching apparatus used in the second embodiment are omitted.

The plasma etching method according to the present embodiment relates to forming a via hole through a wafer using the so-called TSV (Through-Silicon Via) technology in order to form a via electrode within a three-dimensionally stacked semiconductor device. That is, the plasma etching method according to the present embodiment differs from that of the first embodiment in that it involves etching a bonded wafer that includes a wafer on which a via hole is formed (also referred to as "device wafer") and a support wafer to which the device wafer is bonded via an adhesive.

Figure 16:
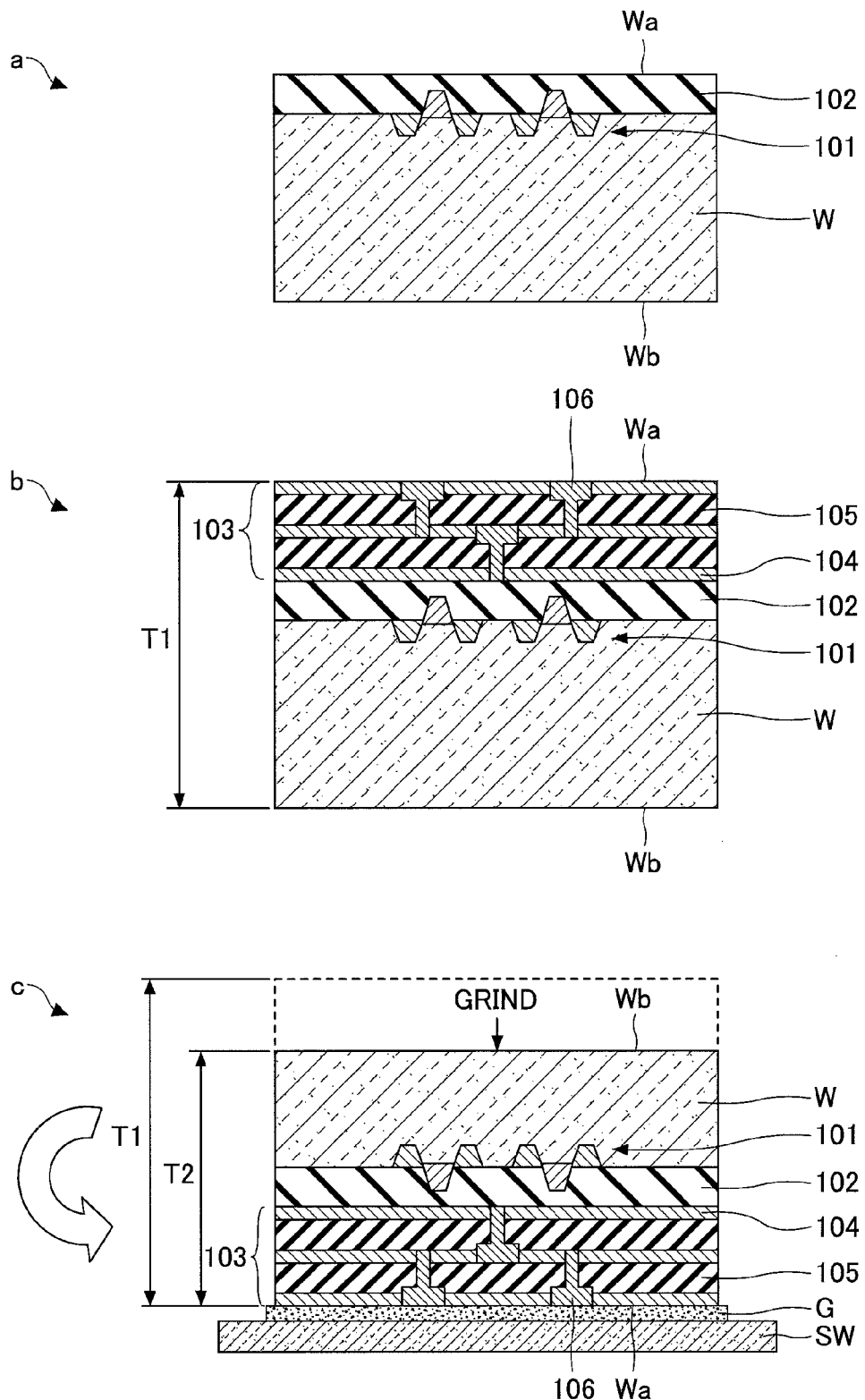
FIG. 16 illustrates states of a wafer in process steps of a semiconductor device manufacturing method including a plasma etching method according to a second embodiment of the present invention.
Figure 17:
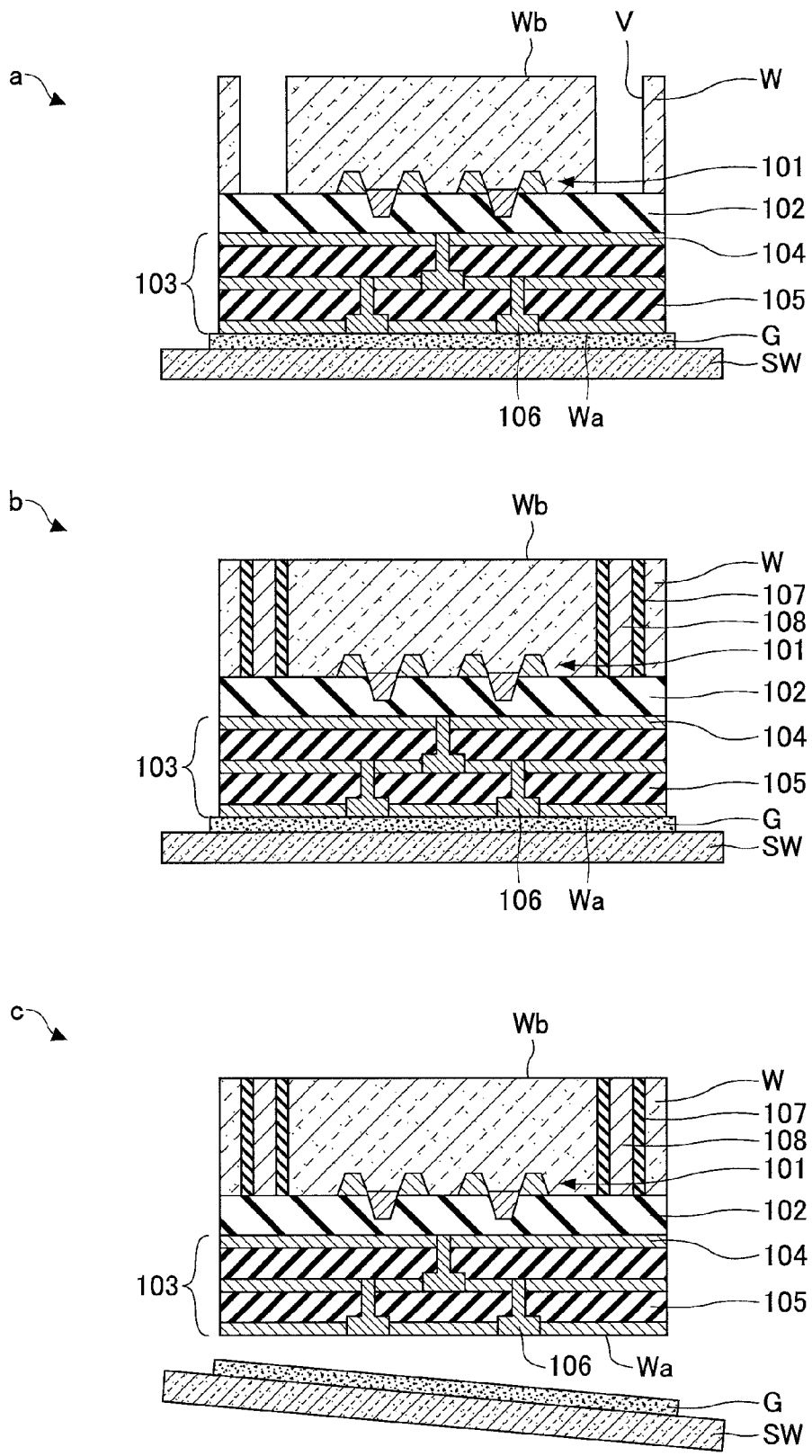
FIG. 17 illustrates states of a wafer in process steps of the semiconductor device manufacturing method including the plasma etching method according to the second embodiment.

FIGS. 16 and 17 are cross-sectional views illustrating wafer states at various process steps of a semiconductor device manufacturing method including the plasma etching method of the present embodiment.

In FIG. 16, c represents a bonded wafer including a device wafer W and a support wafer SW. The device wafer W is a substrate having a semiconductor device such as a transistor formed on its surface Wa. The support wafer SW is a support substrate for reinforcing the device wafer W when the device wafer W is thinned by a grinding process that is performed on its backside Wb. The device wafer W is bonded to the support wafer SW via an adhesive G.

In the semiconductor device manufacturing method according to the present embodiment, first, a transistor 101 is formed on the surface of the device wafer W, which may be a silicon wafer, for example. Then, an interlayer insulating film 102 is formed on the device wafer W having the transistor 101 formed thereon (see a of FIG. 16).

Next, a wiring structure 103 is formed on the interlayer insulating film 102. The wiring structure 103 is formed on the interlayer insulating film 102 by alternately layering a wiring layer 104 and an insulating film 105 and forming a via hole 106, which penetrates through the insulating film 105 and establishes electrical connection between the wiring layers 104 arranged above and below the insulating film 105 (see b of FIG. 16).

Next, the device wafer W is turned upside down and is bonded to the support wafer SW via an adhesive G to prepare the bonded wafer. The support wafer SW may be a silicon wafer, for example. The support wafer SW acts as a support substrate that reinforces the device wafer W and prevents the device wafer W from warping when the device wafer W is reduced in thickness by a grinding process that is performed on its backside Wb. The bonded wafer is placed on a support member of a grinding apparatus, for example, and the backside Wb of the device wafer W is subject to a grinding process so that the device wafer W may be thinned from a thickness T1 before grinding to a predetermined thickness T2 after grinding (see c of FIG. 16). The predetermined thickness T2 may be 50-200 μm, for example.

Note that in FIGS. 16 and 17, the interlayer insulating film 102 and the wiring structure 103 are not drawn to scale. That is, for purposes of illustration, the thicknesses of the interlayer insulating film 102 and the wiring structure 103 are magnified. However, in actual applications, the interlayer insulating film 102 and the wiring structure 103 are much thinner than the device wafer W itself.

Next, a mask film including a first mask film and a second mask film (not shown), for example, is formed on the backside Wb of the device wafer W. Then, a resist is applied on the mask film after which the resist is exposed and developed into a resist pattern (not shown). The resist pattern is used as a mask to form an opening on the mask film, and the remaining resist is removed by an ashing process in a manner similar to the first embodiment. Then, plasma etching is performed in a manner similar to the first embodiment using the mask film as a mask to etch the backside Wb of the device wafer W and form a via hole V. Then, the mask film remaining on the backside Wb of the device wafer W after the via hole V is formed may be removed by etching, for example (see a of FIG. 17). The diameter of the via hole V may be 1-10 µm, for example. Also, the depth of the via hole V corresponds to the thickness of the thinned device wafer W after its backside Wb has undergone the grinding process. For example, the thickness of the thinned device wafer W may be 50-200 µm.

Next, an insulating film 107 made of polyimide, for example, is arranged to cover the inner peripheral face of the via hole V, and a via electrode 108 is formed within the via hole V having its inner peripheral face covered by the insulating film 107 through an electrolytic plating process, for example (see b of FIG. 17).

Next, the support wafer SW is separated from the device wafer W, so that the device wafer W that is thinned and has the via electrode 108 formed therein may be obtained. For example, the support wafer SW may be separated from the device wafer W by irradiating ultraviolet (UV) light and weakening the adhesion of the adhesive G that is photoreactive (see c of FIG. 17).

In the present embodiment, the plasma etching method according to the first embodiment may be implemented to etch the backside Wb of the device wafer W to form the vial hole V as illustrated in a of FIG. 17. That is, a first mask film and a second mask film may be formed on a silicon layer, a resist film formed on the mask films may be used as a mask to etch the first mask film and the second mask film to form an opening, the first mask film and the second mask film may be used as a mask to etch the silicon layer. In the above plasma etching process, a protective film is deposited on the surface of the second mask film and/or the side wall of a hole that has been formed using a processing gas containing CO gas. In this way, the first mask film and the second mask film may be protected from plasma, the side wall of the hole being formed may be arranged to be substantially vertical with respect to the surface of the substrate, and the silicon layer etching rate may be increased.

Although the present invention is described above with respect to certain illustrative embodiments, the present invention is not limited to these embodiments and various modifications may be made without departing from the spirit or scope of the present invention.

The present application is based on and claims the benefit of priority of Japanese Patent Application No. 2011-154175 filed on Jul. 12, 2011, the entire contents of which are herein incorporated by reference.

DESCRIPTION OF THE REFERENCE NUMERALS 1 chamber (processing chamber)
2 susceptor
4 support
15 first high frequency power supply
20 shower head
23 processing gas supply part
26 second high frequency power supply
35 SF$_6$ gas supply
36 O$_2$ gas supply
38 CO gas supply
40 control unit
51 base substrate (silicon layer)
51a hole
51b side wall
52 first mask film
53 second mask film
54 resist film
55 protective film

The invention claimed is:

1. A plasma etching method for forming a via hole in a bonded wafer including a silicon layer wafer and a support wafer, to be processed using a silicon oxide film that is formed into a predetermined pattern on a first surface of the silicon layer wafer as a mask and etching the silicon layer wafer with plasma of a first processing gas, the plasma etching method comprising:
   forming a transistor on a second surface of the silicon layer wafer opposite to the first surface of the silicon layer wafer;
   forming an interlayer insulating film on the second surface the silicon layer wafer above the transistor;
   inverting the silicon layer wafer and bonding the interlayer insulating film with the support wafer;
   grinding the first surface of the silicon layer wafer prior to forming the silicon oxide film;
   forming a resist film on the silicon oxide film;
   a first depositing step of depositing a protective film on the silicon oxide film using plasma of a second processing gas containing carbon monoxide gas,
   wherein an ashing process is performed on the resist film using a plasma of a third processing gas containing oxygen gas;
   a first etching step of etching the silicon layer wafer with plasma of the first processing gas using the silicon oxide film having the protective film deposited on a surface of the silicon oxide film as a mask;
   a second depositing step of depositing the protective film on a side wall of a hole etched by the first etching step using plasma of the second processing gas; and
   a second etching step of further etching the silicon layer wafer with plasma of the first processing gas using the silicon oxide film having the protective film deposited on the surface as a mask,
   wherein the second depositing step and the second etching step are alternately repeated at least two times each such that the via hole reaches the interlayer insulating film.

2. The plasma etching method as claimed in claim 1, wherein the second depositing step includes depositing the protective film on the side wall of the via hole such that the protective film reaches a bottom of the via hole.

3. The plasma etching method as claimed in claim 1, wherein
   the first depositing step includes removing the resist film with plasma of the second processing gas and depositing the protective film on the surface of the silicon oxide film using the plasma of the second processing gas.

4. The plasma etching method as claimed in claim 1, further comprising removing the resist film remaining after performing the ashing process with plasma of the second processing gas.

5. The plasma etching method as claimed in claim 1, wherein the first etching step includes supplying a first high frequency power having a first frequency to a support part that supports the bonded wafer to be processed, and etching the silicon layer wafer while incrementally increasing a value of the first high frequency power being supplied.

6. The plasma etching method as claimed in claim 1, wherein a value of a first high frequency power that is supplied in the second etching step is increased each time the second etching step is alternately repeated with the second depositing step.

* * * * *